(12) United States Patent
Syo

(10) Patent No.: US 6,484,305 B1
(45) Date of Patent: *Nov. 19, 2002

(54) IMPURITY QUANTITY TRANSFER DEVICE ENABLING REDUCTION IN PSEUDO DIFFUSION ERROR GENERATED AT INTEGRAL INTERPOLATION OF IMPURITY QUANTITIES AND IMPURITY INTERPOLATION METHOD THEREOF

(75) Inventor: Toshiyuki Syo, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/110,668

(22) Filed: Jul. 7, 1998

(30) Foreign Application Priority Data

Jul. 7, 1997 (JP) ............................................. 9-181464

(51) Int. Cl.[7] .............................................. G06F 17/50
(52) U.S. Cl. ....................................................... 716/20
(58) Field of Search ........................................... 716/20

(56) References Cited

U.S. PATENT DOCUMENTS

| 5,617,322 | A | * | 4/1997 | Yokota | 364/468.04 |
| 5,677,846 | A | * | 10/1997 | Kumashiro | 364/488 |
| 5,880,977 | A | * | 3/1999 | Syo | 364/578 |
| 5,930,494 | A | | 7/1999 | Akiyama et al. | |
| 5,936,869 | A | * | 8/1999 | Sakaguchi et al. | 364/578 |
| 5,963,732 | A | | 10/1999 | Syo | |
| 6,011,914 | A | * | 1/2000 | Akiyama | 395/500.35 |

FOREIGN PATENT DOCUMENTS

JP 7-219977 8/1995

OTHER PUBLICATIONS

W.M. Coughran et al., Adaptive Grid Generation for VLSI Device Simulation, IEEE Computer–Aided Design of Integrated Circuits and Systems, pp. 1259–1275, Oct. 1991.*
T. Syo et al., A Triangular Mesh With the Interface Protection Layer Suitable for the Diffusion Simulation, International Conference on Simulation of Semiconductor Processes and Devices, SISPAD 1996, Sep. 1996.*
Coughran W. M. Jr. et al.: "Adaptive Grid Generation for VSLI Device Simulation" IEEE Transactions on Computer–Aided Design of Integrated circuits and Systems, Oct. 1991, USA, vol. 10, No. 10, pp. 1259–1275, XP000264654.
Burglar J.F. et al: "An Adaptive Grid Refinement Strategy for the Drift–Diffusion Equations" IEEE Integrated on Computer–Aided Design of Integrated Circuits and Systems, Oct., 1991 USA, vol. 10, No. 10, pp. 1251–1258, XP000264653, ISSN: 0278–0070.

* cited by examiner

*Primary Examiner*—Vuthe Siek
*Assistant Examiner*—A. M. Thompson
(74) *Attorney, Agent, or Firm*—Sughrue Mion, PLLC

(57) ABSTRACT

An impurity quantity transfer device and method for conducting a numerical analysis of a semiconductor device diffusion process, applying integral interpolation of diffusion impurity quantities and obtaining an accurate impurity concentration distribution with a reduced pseudo diffusion, even at a region with a sharp impurity concentration gradient. A control volume region is generated to bridge a plurality of mesh elements of an interpolation destination mesh, and a subdivisional control volume is generated for an interpolation source mesh. The impurity quantities are summed for the grid points on the source mesh, and a initial impurity concentration is generated for the control volume region. The initial impurity concentration is multiplied by a conversion coefficient to produce a formal impurity concentration. From the formal impurity concentration, an impurity quantity corresponding to each grid point on the destination mesh is calculated. For further refinement, the errors caused by pseudo diffusion are estimated, and mesh points are added in regions where precision is otherwise insufficient.

21 Claims, 9 Drawing Sheets

IMPURITY QUANTITY TRANSFER DEVICE ENABLING REDUCTION IN PSEUDO DIFFUSION ERROR GENERATED AT INTEGRAL INTERPOLATION OF IMPURITY QUANTITIES AND IMPURITY INTERPOLATION METHOD THEREOF

BACKGROUND OF THE INVENTION

1. Field of the Invention

The present invention relates to an impurity quantity transfer device which conducts, in numerical analysis of a semiconductor device, integral interpolation of impurity quantities among meshes generated on a semiconductor device to be processed for use in process device simulation and an impurity interpolation method thereof.

2. Description of the Related Art

At the oxidation and diffusion steps of a semiconductor manufacturing process, configuration of a semiconductor to be processed changes through the steps. For reproducing such a phenomenon by using a process simulator, configuration and a diffusion time are discretized, respectively. Discretization is employed because a diffusion equation used for oxidation and diffusion is non-linear and also because such a strong non-linear physical phenomenon as initial accelerating oxidation exists.

As a conventional technique of space discretization by a two-dimensional (2D) process simulator, the control volume method (hereinafter referred to as C.V. method) having excellent configuration-adaptability is widely used. In the C.V. method, space is represented by triangular meshes on which a control volume is defined with respect to each grid point (mesh point). Control volume denotes a polygon obtained by finding circumcenters of triangular elements having a relevant mesh point as a vertex and sequentially connecting the circumcenters of adjacent triangles (i.e. triangle sharing a side). Such a control volume obtained as a polygon is a grid-based control volume. In the C.V. method, a flow of physical quantities (e.g. current) on a mesh edge is represented as a quantity obtained by multiplying a density of the flow (e.g. current density) on the edge in question by a length of a side of a control volume which side crosses with the mesh edge in question (in general, referred to as a cross section also in two-dimensional space).

Depending on the configuration of a triangular mesh, however, sequentially connecting circumcenters of adjacent mesh triangles in a manner as mentioned above fails to have one (convex) polygon. In other words, sides of a control volume cross with each other. In this case, a cross section of the control volume takes a negative value in calculation, so that a flow of physical quantities on a mesh edge will be in the opposite direction to a density of the flow, causing increase in analysis errors.

To prevent such a situation, Delaunay division is employed. A line connecting circumcenters of mesh triangles fails to form a (convex) polygon when within a circumcircle of a predetermined triangular element on meshes, a vertex of other triangular element exists. It is therefore necessary to divide the meshes such that inside each circumcircle of every triangular element on the meshes, there falls none of the mesh points of other triangular elements. Such division is called Delaunay division. In the simulation employing the C.V. method, ensuring a calculation precision requires the Delaunay division to be ensured for a mesh as a unit of discretization of configuration.

In the simulation of an oxidation process, configuration of a semiconductor changes with time as mentioned above. When the configuration changes during the simulation due to oxidation processing, regeneration of a mesh is needed for ensuring the Delaunay division. On this occasion, it is necessary to transfer an impurity value defined with respect to a mesh yet to be regenerated to a regenerated mesh. In the C.V. method, an impurity concentration is defined with a mesh point (grid point) existing one in a control volume as a representative point.

Methods of defining an impurity concentration at a regenerated mesh include a method by analytical calculation of an impurity concentration as is used for log alignment and a method employing integral interpolation in which dose is preserved. For highly precise diffusion simulation, the integral interpolation method in which dose is preserved is employed. At a pn junction portion where an impurity concentration difference between grids is large, however, pseudo diffusion occurs which is a phenomenon of transfer of impurity quantities toward a grid of low impurity value caused as a result of impurity interpolation.

FIG. 8 is a flow chart showing a procedure of an integral interpolation method. First, with respect to a regenerated mesh, a grid-based control volume is defined (Step 801). Next, with respect to a mesh yet to be regenerated, a grid-based control volume is defined (Step 802). A grid-based control volume is a polygonal region obtained by connecting a circumcenter of each triangular element sharing a grid point as described above.

Next, the grid-based control volume for the mesh yet to be regenerated is converted into a control volume triangle (hereinafter referred to as C.V. triangle) on a triangular mesh basis (Step 803). A triangular-mesh-based C.V. triangle represents a region divided by the respective sides of triangular elements on triangular meshes and the respective sides of the above-described grid-based control volume (polygon). Impurity concentration at each C.V triangle is made equal to an impurity concentration at an original grid-based control volume. Impurity quantities is therefore distributed in proportion to an area of a C.V. triangle.

Next, an area of overlap (hereinafter referred to as overlap area) is calculated between a pattern of a grid-based control volume on the regenerated mesh and a triangular-mesh-based C.V. triangle on the mesh yet to be regenerated (Step 804). After the calculation of an overlap area, an impurity quantity within the C.V. triangle proportional to the calculated overlap area is transferred to the grid-based control volume on the regenerated mesh (Step 805). After the transfer, determination is made whether the impurity quantities of all the C.V. triangles have been transferred to the grid-based C.V. on the regenerated mesh (Step 806), and when the transfer is yet to be completed, Steps 804 and 805 will be repeated and when it is completed, integral interpolation of impurities is finished.

Consideration will be given to change of an impurity concentration, that is, pseudo diffusion, occurring when integral interpolation of impurities is conducted by the above-described conventional impurity interpolation method. Here, vertical profiles are obtained assuming that with a space between meshes fixed on the premise of one-dimensional structure, integral interpolation is conducted with only a position of a mesh staggered by half a cycle. The obtained result is shown in FIG. 9. In FIG. 9, a curve 901 represents an initial impurity profile, a curve 902 represents an impurity profile obtained after the integral interpolation is conducted once by the above method, and curves 903 and 904 represent impurity profiles obtained after the integral interpolation is conducted ten times and 100 times by the above method, respectively.

In the above-described conventional method, when a region of a control volume on a regenerated mesh bridges a control volume region of extremely high impurity concentration and a control volume region of low impurity concentration on a mesh yet to be regenerated due to impurity interpolation, so a large quantity of impurities will be transferred from the region of high impurity concentration toward the region of low concentration, that transfer of the impurity quantities within the region of lower impurity concentration is negligible. As a result, the impurity quantity is propagated toward the region of lower impurity concentration to cause large pseudo diffusion. As can be seen from FIG. 9, as few as ten times of repetition of impurity interpolation causes large pseudo diffusion.

In the simulation of oxidation steps, one oxidation step is divided into several time-steps to calculate time required for one oxidation step. Since one step is in common divided into approximately ten for calculation, the conventional method in which obvious pseudo diffusion appears by approximately ten times of impurity interpolation enables no simulation of oxidation step to have high precision. Under these circumstances, realization of an impurity interpolation method involving reduced pseudo diffusion has been demanded.

As described above, since a conventional impurity interpolation method conducts integral interpolation of impurity quantities for the transfer of impurities between meshes on the premise that impurity concentration is uniform within a control volume, if a difference in impurity concentration between meshes is large, a higher impurity concentration value will be dominant at a region whose concentration gradient is sharp to cause large pseudo diffusion.

Furthermore, since in a conventional method, no estimate of errors caused by pseudo diffusion is made at the time of integral interpolation of impurities, introduction of the processing for reducing errors caused by the pseudo diffusion is impossible.

Oxidation process simulation and diffusion simulation using an adaptive mesh which follows an impurity concentration require processing of regenerating a mesh. The mesh regeneration processing then requires interpolation of impurities between a mesh yet to be regenerated and a regenerated mesh. Integral interpolation of impurities by the above-described conventional method causes pseudo diffusion, and particularly in the vicinity of a pn junction in which a gradient of a profile concentration is sharp, causes obvious pseudo diffusion, resulting in changing the profile to have a moderate concentration gradient.

SUMMARY OF THE INVENTION

An object of the present invention is to provide an impurity quantity transfer device capable of obtaining an accurate impurity concentration distribution with reduced pseudo diffusion even at a region whose impurity concentration gradient is sharp and an impurity interpolation method thereof.

Another object of the present invention is to provide an impurity quantity transfer device capable of conducting integral interpolation of impurities to high precision by the integral interpolation of impurities, estimating errors caused by pseudo diffusion and adding a mesh point when the precision is insufficient and an impurity interpolation method thereof.

According to the first aspect of the invention, in semiconductor device process simulation, an impurity quantity transfer device which transfers, according to deformation of a semiconductor device, an impurity value defined on a first mesh generated on the semiconductor device before the deformation to a second mesh generated on the semiconductor device after the deformation, comprises control volume generation means for generating, on the second mesh, a grid-based control volume region bridging a plurality of mesh elements, subdivisional control volume generation means for generating, on the first mesh, a mesh-based control volume subdivisional on a mesh element basis, impurity quantity calculation means for calculating a sum of impurity quantities corresponding to each grid point on the first mesh based on a total area of the mesh-based control volume surrounding the grid point and an impurity concentration at the grid, impurity quantity setting means for tentatively setting, with respect to the mesh-based control volume, an impurity concentration of the control volume by using an impurity concentration of each vertex of mesh elements on the first mesh covering the control volume, as well as determining an impurity concentration of each the mesh-based control volume by using the tentative set value and a conversion coefficient which will be described later, impurity quantity comparison means for accumulating, based on an area of each the mesh-based control volume connected to a grid point on the first mesh and an impurity concentration tentatively set by the impurity quantity setting means, impurity quantities corresponding to the grid point on the first mesh, as well as comparing a sum of impurity quantities calculated by the impurity quantity calculation means and the accumulated impurity quantities to obtain a conversion coefficient allowing the compared values to agree with each other, and impurity quantity transfer means for calculating, with respect to each the mesh-based control volume, an area of an overlap region between the mesh-based control volume and the grid-based control volume region on the second mesh and transferring an impurity quantity of the mesh-based control volume to the grid-based control volume region on the second mesh according to the calculated area to calculate an impurity quantity corresponding to each grid point on the second mesh.

In the preferred construction, the impurity quantity transfer means divides a calculated impurity quantity corresponding to each grid point on the second mesh by an area of a grid-based control volume on the second mesh to determine an impurity concentration corresponding to each grid point on the second mesh.

In the preferred construction, the impurity quantity setting means takes an impurity concentration obtained by the linear interpolation based on an impurity concentration of each vertex of mesh elements on the first mesh as a tentative set value of an impurity concentration at the control volume in question, and determines, as an impurity concentration at the control volume in question, a value obtained by multiplying the tentative set value by a conversion coefficient 'α' obtained by the impurity quantity comparison means according to the following expression:

$$\alpha = \frac{\text{sum of impurity quantities in}}{\text{sum of impurity quantities in}}$$
$$\text{C.V. held by the grid in question}}{\text{C.V. triangles containing the grid in question}}$$

In another preferred construction, the impurity quantity setting means takes an impurity concentration obtained by the linear interpolation based on an impurity concentration of each vertex of mesh elements on the first mesh as a tentative set value of an impurity concentration at the control volume in question, and determines, as an impurity concentration at the control volume in question, a value obtained by multiplying the tentative set value by a conversion coefficient 'α' obtained by the impurity quantity comparison means according to the following expression:

$$\alpha = \frac{\text{sum of impurity quantities in C.V. held by the grid in question}}{\text{sum of impurity quantities in C.V. triangles containing the grid in question}}$$

the impurity quantity transfer means divides a calculated impurity quantity corresponding to each grid point on the second mesh by an area of a grid-based control volume on the second mesh to determine an impurity concentration corresponding to each grid point on the second mesh.

In another preferred construction, the impurity quantity transfer device further comprises error calculation means for calculating an error caused by pseudo diffusion in integral interpolation by using an impurity concentration determined by the impurity quantity setting means, and local mesh generation means for generating, when determination is made that the error calculated by the error calculation means will be not less than a predetermined value, a local mesh so as to reduce the error.

In another preferred construction, the impurity quantity transfer device further comprises error calculation means for calculating an error caused by pseudo diffusion in integral interpolation by using an impurity concentration determined by the impurity quantity setting means, and local mesh generation means for generating, when determination is made that the error calculated by the error calculation means will be not less than a predetermined value, a local mesh so as to reduce the error, wherein the impurity quantity transfer means divides a calculated impurity quantity corresponding to each grid point on the second mesh by an area of a grid-based control volume on the second mesh to determine an impurity concentration corresponding to each grid point on the second mesh.

In another preferred construction, the impurity quantity transfer device further comprises error calculation means for calculating an error caused by pseudo diffusion in integral interpolation by using an impurity concentration determined by the impurity quantity setting means, and local mesh generation means for generating, when determination is made that the error calculated by the error calculation means will be not less than a predetermined value, a local mesh so as to reduce the error, wherein the impurity quantity setting means takes an impurity concentration obtained by the linear interpolation based on an impurity concentration of each vertex of mesh elements on the first mesh as a tentative set value of an impurity concentration at the control volume in question, and determines, as an impurity concentration at the control volume in question, a value obtained by multiplying the tentative set value by a conversion coefficient 'α' obtained by the impurity quantity comparison means according to the following expression:

$$\alpha = \frac{\text{sum of impurity quantities in C.V. held by the grid in question}}{\text{sum of impurity quantities in C.V. triangles containing the grid in question}}$$

According to the second aspect of the invention, in semiconductor device process simulation, an impurity interpolation method of transferring, according to deformation of a semiconductor device, an impurity value defined on a first mesh generated on the semiconductor device before the deformation to a second mesh generated on the semiconductor device after the deformation, comprising the steps of generating, on the second mesh, a grid-based control volume region bridging a plurality of mesh elements, generating, on the first mesh, a mesh-based control volume subdivisional on a mesh element basis, calculating a sum of impurity quantities corresponding to each grid point on the first mesh based on a total area of the mesh-based control volume surrounding the grid point and an impurity concentration at the grid, tentatively setting, with respect to the mesh-based control volume, an impurity concentration of the control volume by using an impurity concentration of each vertex of mesh elements on the first mesh covering the control volume, based on an area of each the mesh-based control volume connected to a grid point on the first mesh and the tentatively set impurity concentration, accumulating impurity quantities corresponding to the grid point on the first mesh, comparing a sum of impurity quantities calculated at the impurity quantity calculation step and the accumulated impurity quantities to obtain a conversion coefficient allowing the compared values to agree with each other, determining an impurity concentration of each the mesh-based control volume by using the tentative set value and the conversion coefficient, calculating, with respect to each the mesh-based control volume, an area of an overlap region between the mesh-based control volume and the grid-based control volume region on the second mesh, and transferring an impurity quantity of the mesh-based control volume to the grid-based control volume region on the second mesh according to a calculated area to calculate an impurity quantity corresponding to each grid point on the second mesh.

In the preferred construction, the impurity interpolation method further comprising a step of dividing an impurity quantity corresponding to each grid point on the second mesh calculated at the impurity quantity transfer step by an area of a grid-based control volume on the second mesh to determine an impurity concentration corresponding to each grid point on the second mesh.

In the preferred construction, at the impurity quantity tentative setting step, an impurity concentration obtained by the linear interpolation based on an impurity concentration of each vertex of mesh elements on the first mesh is taken as a tentative set value of an impurity concentration at the control volume in question, and at the impurity quantity determination step, a value obtained by multiplying the tentative set value by a conversion coefficient 'α' obtained by the impurity quantity comparison step according to the following expression is determined as an impurity concentration at the control volume in question:

$$\alpha = \frac{\text{sum of impurity quantities in C.V. held by the grid in question}}{\text{sum of impurity quantities in C.V. triangles containing the grid in question}}$$

In another preferred construction, the impurity interpolation method further comprising the steps of calculating an error caused by pseudo diffusion in integral interpolation by using an impurity concentration determined at the impurity quantity determination step, and generating, when determination is made that the error calculated at the error calculation step will be not less than a predetermined value, a local mesh so as to reduce the error, wherein at the overlap area calculation step, targeting each the mesh-based control volume on which the local mesh has been generated, an area of an overlap region is calculated between the mesh-based control volume and the grid-based control volume region on the second mesh, and the error calculation step, the local mesh generation step, the overlap area calculation step and the impurity quantity transfer step are repeated until the error calculated at the error calculation step goes below the predetermined value.

According to another aspect of the invention, in semiconductor device process simulation, a computer j readable memory storing a computer program for controlling an impurity quantity transfer device which transfers, according to deformation of a semiconductor device, an impurity value defined on a first mesh generated on the semiconductor device before the deformation to a second mesh generated on the semiconductor device after the deformation, the computer program comprising the steps of generating, on the second mesh, a grid-based control volume region bridging a plurality of mesh elements, generating, on the first mesh, a mesh-based control volume subdivisional on a mesh element basis, calculating a sum of impurity quantities corresponding to each grid point on the first mesh based on a total area of the mesh-based control volume surrounding the grid point and an impurity concentration at the grid, tentatively setting, with respect to the mesh-based control volume, an impurity concentration of the control volume by using an impurity concentration of each vertex of mesh elements on the first mesh covering the control volume, based on an area of each the mesh-based control volume connected to a grid point on the first mesh and the tentatively set impurity concentration, accumulating impurity quantities corresponding to the grid point on the first mesh, comparing a sum of impurity quantities calculated at the impurity quantity calculation step and the accumulated impurity quantities to obtain a conversion coefficient allowing the compared values to agree with each other, determining an impurity concentration of each the mesh-based control volume by using the tentative set value and the conversion coefficient, calculating, with respect to each the mesh-based control volume, an area of an overlap region between the mesh-based control volume and the grid-based control volume region on the second mesh, and transferring an impurity quantity of the mesh-based based control volume to the grid-based control volume region on the second mesh according to a calculated area to calculate an impurity quantity corresponding to each grid point on the second mesh.

Other objects, features and advantages of the present invention will become clear from the detailed description given herebelow.

BRIEF DESCRIPTION OF THE DRAWINGS

The present invention will be understood more Th fully from the detailed description given herebelow and from the accompanying drawings of the preferred embodiments of the invention, which, however, should not be taken to be limitative to the invention, but are for explanation and understanding only.

In the drawings.

DESCRIPTION OF THE PREFERRED EMBODIMENTS

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
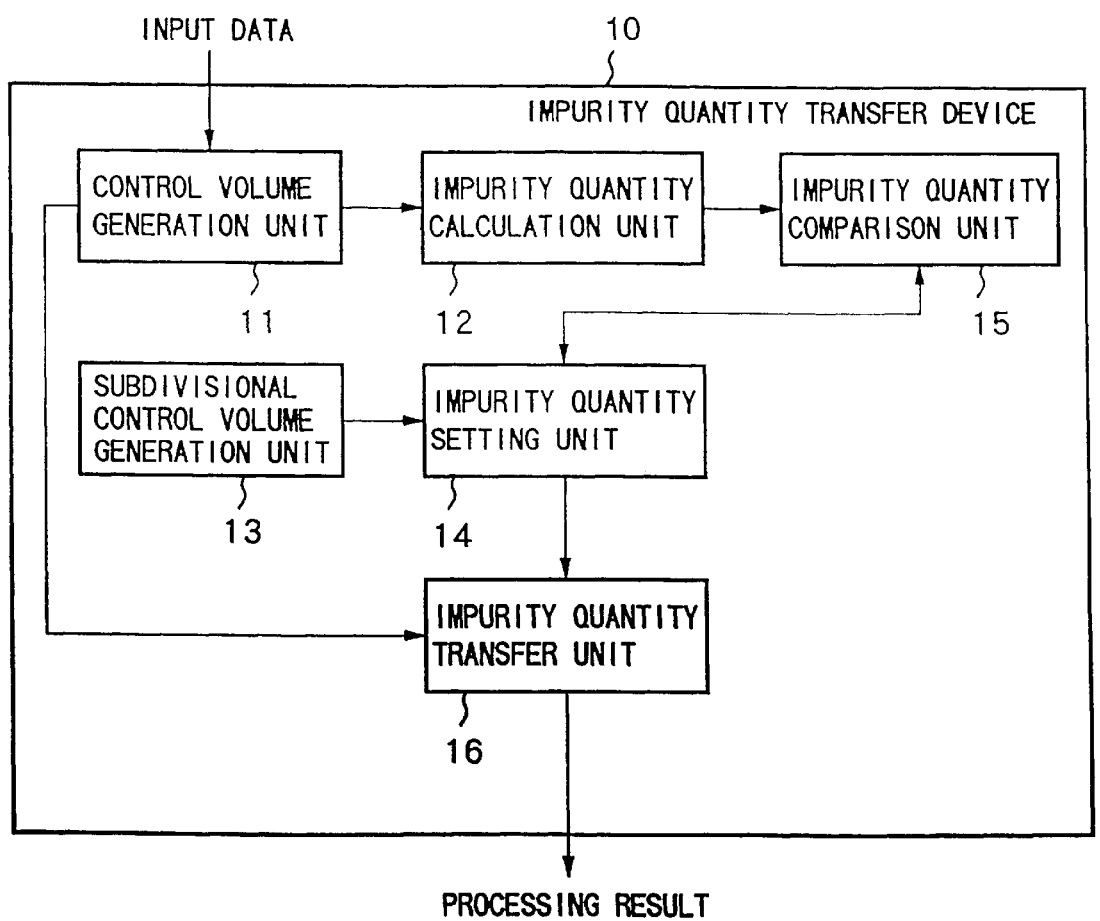
FIG. 1 is a block diagram showing structure of an impurity quantity transfer device according to one embodiment of the present invention.

FIG. 1 is a block diagram showing structure of an impurity quantity transfer device according to one embodiment of the present invention. An impurity quantity transfer device 10 of the present embodiment receives input data such as outline (configuration) of a semiconductor device to be processed, a mesh to be regenerated and a regenerated mesh, and an interpolation error allowable value to output, as a processing result, a result of transfer of impurity quantities proportional to an overlap area between a C.V. triangle and a control volume of a regenerated mesh to the control volume of the regenerated mesh.

With reference to FIG. 1, the impurity quantity transfer device 10 of the present embodiment includes a control volume generation unit 11 for generating a grid-based control volume based on input data, an impurity quantity calculation unit 12 for calculating, out of control volumes generated by the control volume generation unit 11, an impurity quantity that each grid accounts for on a mesh yet to be regenerated as a source of interpolation, a subdivisional control volume generation unit 13 for generating a C.V. triangle for a mesh yet to be regenerated which is generated by the control volume generation unit 11, an impurity quantity setting unit 14 for tentatively setting an impurity concentration in each C.V. triangle generated by the subdivisional control volume generation unit 13, as well as multiplying a tentative set value by a conversion coefficient "α" to determine an impurity concentration, an impurity quantity comparison unit 15 for comparing the impurity quantity on a grid basis calculated by the impurity quantity calculation unit 12 and the impurity quantity calculated from an impurity concentration tentatively set by the impurity quantity setting unit 14 to calculate the above-describe conversion coefficient "α" such that the two values agree with each other, and an impurity quantity transfer unit 16 for transferring impurity quantities based on a control volume of a regenerated mesh which is generated by the control volume generation unit 11 and an impurity concentration determined by the impurity quantity setting unit 14. The impurity quantity transfer unit 16 obtains an overlap area between a C.V triangle to which concentration distribution is applied based on an impurity concentration determined by the impurity quantity setting unit 14 and a control volume of a regenerated mesh to transfer an impurity quantity proportional to the obtained overlap area to the control volume of the regenerated mesh and outputs the obtained result. In FIG. 1, illustration is made only of a characteristic part of structure of the present embodiment and that of the remaining common part is omitted.

The impurity quantity transfer device 10 of the present embodiment is implemented by a computer system such as a workstation or a personal computer, and its components, which are the above-described function execution units, are implemented by a program-controlled CPU and an internal memory such as a RAM in the computer system. The computer program controlling the CPU is stored for provision in a common storage medium such as a magnetic disk, an optical disk, or a semiconductor memory and is loaded into the computer system to execute processing by the respective function execution units which will be described later.

Figure 2:
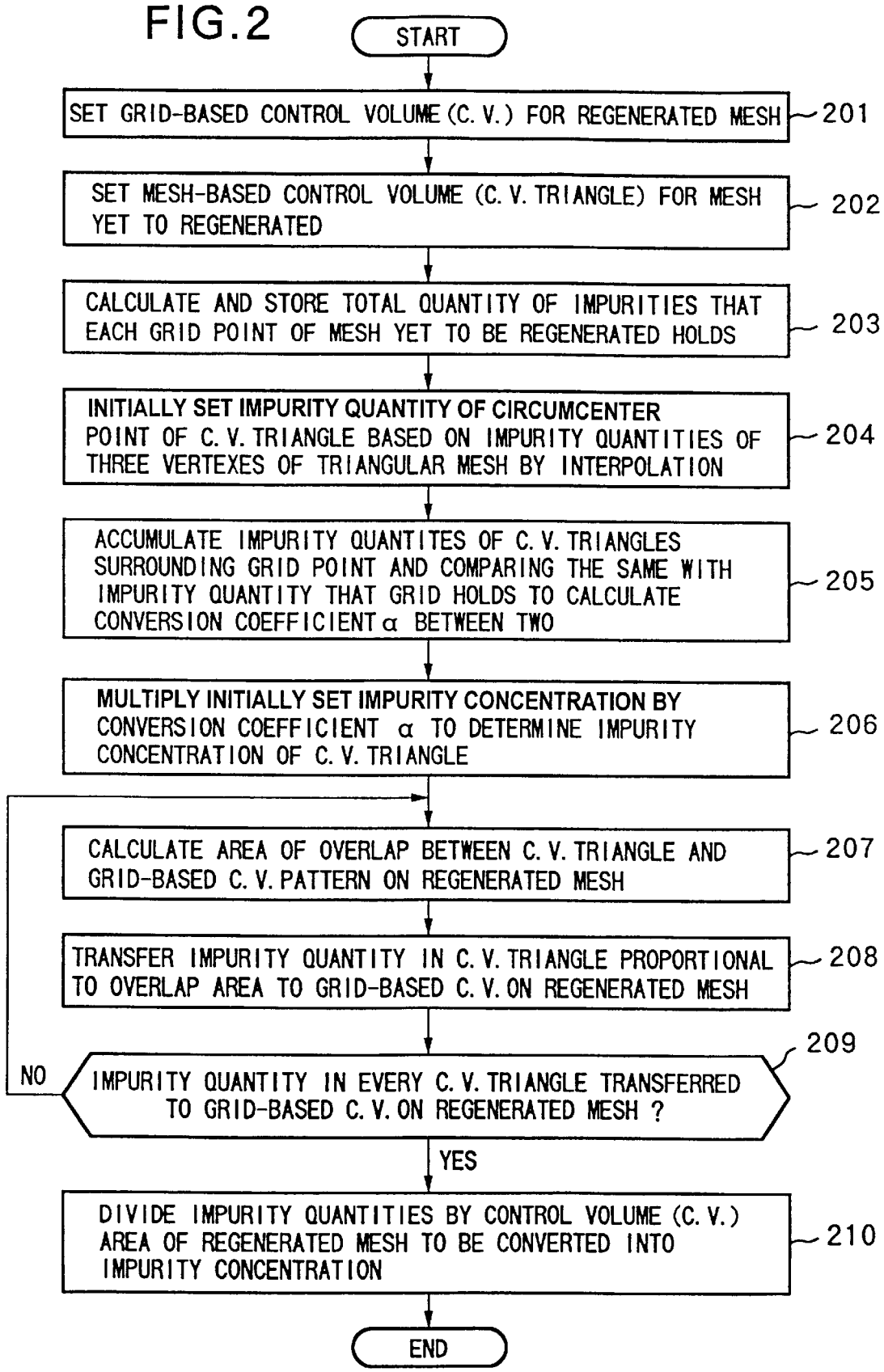
FIG. 2 is a flow chart showing operation of impurity interpolation processing according to the present embodiment.

Operation of impurity interpolation processing according to the present embodiment will be described with reference to the flow chart of FIG. 2.

Figure 3:
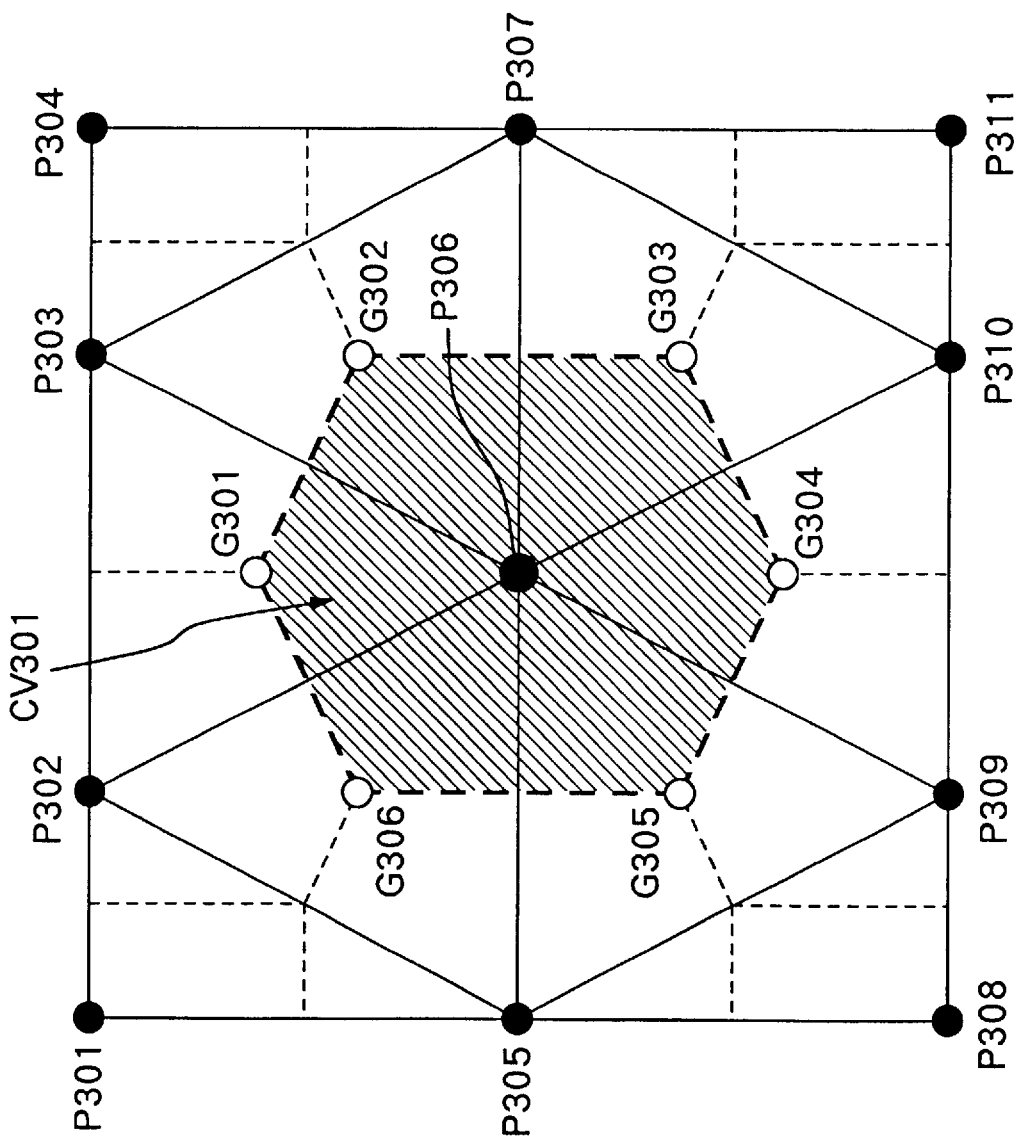
FIG. 3 is a diagram showing a grid-based control volume region.

With respect to a mesh yet to be regenerated which is obtained as a result of the Delaunay division made on device configuration in advance, that is, a mesh as an interpolation source (hereinafter referred to as old mesh), a regenerated mesh, that is, a mesh as an interpolation destination (hereinafter referred to as new mesh) is initially generated. Then, first, the control volume generation unit 11 sets a grid-based control volume region on the new mesh (Step 201). An example of a grid-based control volume region is shown in FIG. 3. In FIG. 3, grid points are denoted as P301 to P311. Noting the grid point P306 here, the grid point P306 is shared by six triangular elements and circumcenter points of the triangular elements are G301 to G306, respectively. A region of a polygon G301-G302-G303-G304-G305-G306 (slanting line area in the figure) obtained by sequentially connecting these circumcenter points in the order of the triangles is a control volume region on a grid basis containing the grid point P306. Dashed line in the figure represents a bisector perpendicular to each side of the triangular elements.

Figure 4:
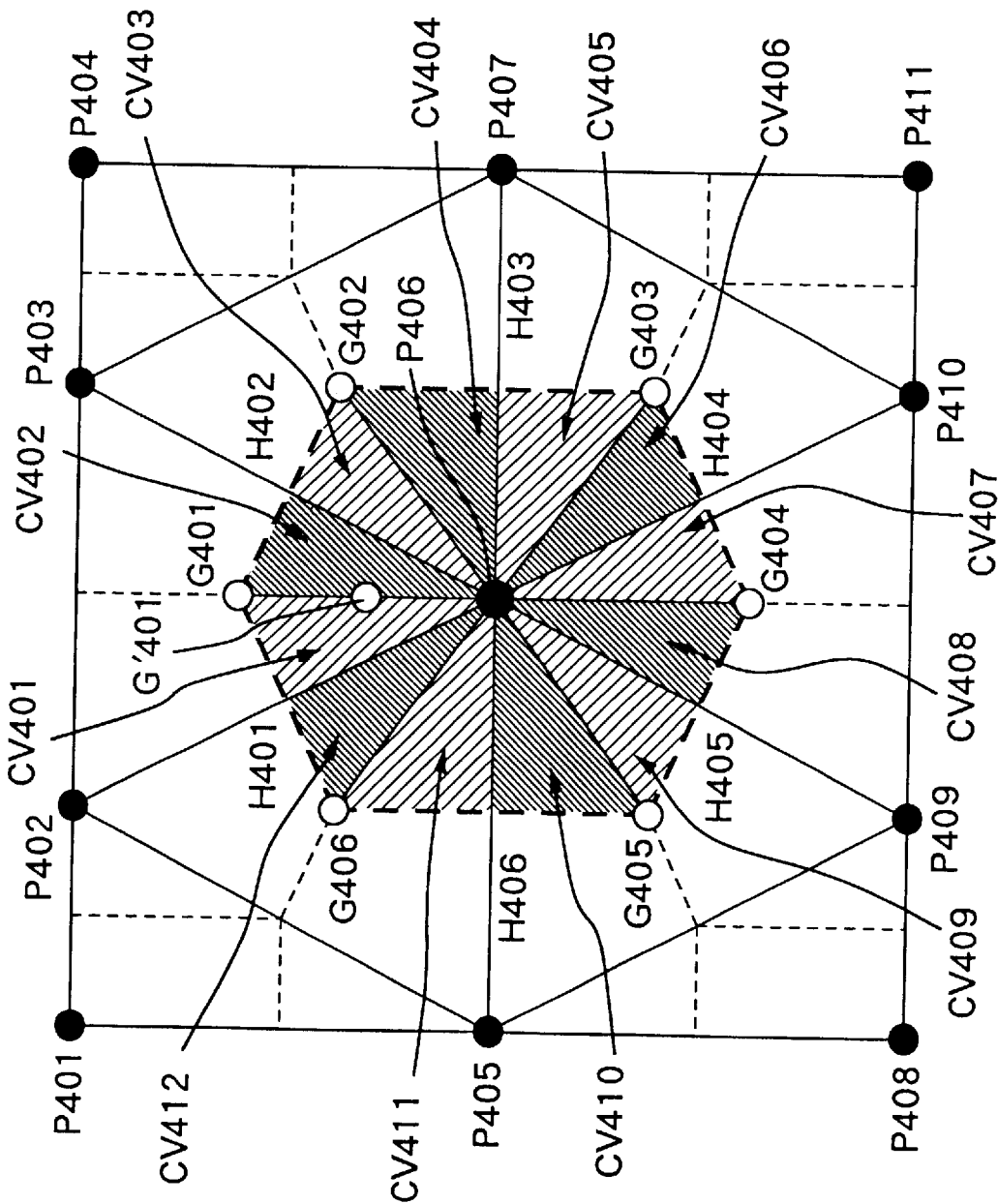
FIG. 4 is a diagram for use in explaining a mesh-based control volume.

Next, the subdivisional control volume generation unit 13 defines, for the old mesh, a control volume on a triangular mesh basis, that is, a C.V. triangle (Step 202). An example of a mesh-based control volume is shown in FIG. 4. In FIG. 4, grid points are denoted as P401 to P411. Noting the grid point P406 here, the grid point P406 is shared by six triangular elements. Circumcenter points of the triangular elements are G401 to G406, respectively. Intersections between a polygon G401-G402-G403-G404-G405-G406 (circumferential side of the grid-based control volume region) obtained by sequentially connecting these circumcenter points in the order of the triangles and six sides of the respective triangular elements whose one end is the grid point P406 are represented as H401 to H406, respectively. A control volume region on a mesh basis will be therefore a, triangle whose vertexes are the grid point P406, any of the circumcenter points G401 to G406 and one of the above-described intersections H401 to H406 adjacent to the relevant circumcenter point. Such a triangle will be set so as to exactly fill grid-based control volume region. Set with respect to the grid point P406 are 12 triangles CV401, to CV412 denoted by slanting lines in the figure.

Next, the impurity quantity calculation unit 12 calculates, with respect to each grid point of the old mesh, a total quantity of impurities existing in control volumes connecting to the grid point in question (i.e. in a grid-based control volume) and stores the same as the impurity quantity that the grid point accounts for (Step 203). More specifically, a total quantity of impurities is calculated by multiplying an impurity concentration at a grid point by an area of a grid-based control volume containing the grid point.

Subsequently, the impurity quantity setting unit 14 tentatively sets an impurity concentration Ctmp (i,j) of a circumcenter point of each C.V. triangle (Step 204). Since each C.V. triangle is a rectangular triangle whose hypotenuse is a line segment connecting a grid point (grid point P406 in the example shown in FIG. 4) and a circumcenter point (circumcenter points G401 to G406 in the example shown in FIG. 4) of a triangular element having the grid point as a vertex, circumcenter points of the C.V. triangles sharing the hypotenuse coincide with each other (the coincident circumcenter point will be referred to as common circumcenter point) to lie on the common hypotenuse. In the example shown in FIG. 4, circumcenter points of CV401 and CV402 coincide with each other (which will be referred to as common circumcenter point G' 401) and lie on a line segment linking the grid point P406 and the circumcenter point G401 of the triangular element P402-P403-P406.

Tentative setting employs a linear interpolation method based on an impurity concentration of each vertex of a triangular mesh containing the above-described common circumcenter point G. In the example shown in FIG. 4, since the common circumcenter point G' 401 exists within the triangular element P402-P403-P406, an impurity concentration at the common circumcenter point G' 401 is calculated from impurity concentrations of the respective grid points P402, P403 and P406 by linear interpolation and the calculated impurity concentration is taken as the impurity concentration at the C.V. triangles CV401 and CV402. By multiplying thus obtained impurity concentration Ctmp(i,j) of the C.V. triangle by an area of the C.V. triangle in question, a tentative impurity quantity of the C.V. triangle in question can be calculated.

After a tentative impurity quantity in each C.V. triangle on the old mesh is thus calculated, the impurity quantity comparison unit 15 obtains, with respect to each grid point, an accumulation value of the impurity quantities in the C.V. triangles connected to the grid in question (having the grid point as its vertex) (Step 205). Then, the unit 15 compares the obtained accumulation value with the impurity quantity of the grid in question obtained at Step 203 [sum of impurity quantities in control volume (C.V.)] to calculate a conversion coefficient 'α' according to the following expression (1) such that the two values agree with each other.

$$\alpha = \frac{\text{sum of impurity quantities in C.V. held by the grid in question}}{\text{sum of impurity quantities in C.V. triangles containing the grid in question}} \quad (1)$$

After the calculation of the conversion coefficient 'α', the impurity quantity setting unit 14 multiplies the impurity concentration Ctmp(i,j) of each C.V. triangle tentatively set at Step 204 by the conversion coefficient 'α' as shown by the following expression (2) and determines the obtained value as a formal impurity concentration C(i,j) at each C.V. triangle (Step 206).

$$C(i,j) = \alpha \times C\text{tmp}(i,j) \quad (2)$$

The processing of the present Step 206 enables characteristics of integral interpolation to be maintained in which dose is preserved.

After the determination of a formal impurity concentration C(i,j) of each C.V. triangle, the impurity quantity transfer unit 16 calculates an area of overlap region (overlap area) between the grid-based control volume on the new mesh generated at Step 201 and the C.V. triangle on the old mesh generated at Step 202 (Step 207). Then, the unit 16 multiplies the obtained overlap area by the impurity concentration C(i,j) at the relevant C.V. triangle and transfers the obtained value Th as the impurity quantity to the control volume of the regenerated mesh (new mesh) (Step 208).

Since in general, one control volume on a new mesh bridges a plurality of C.V triangles on an old mesh, determination is made with respect to every C.V. triangle overlapping with the grid-based control volume on the new mesh whether an impurity quantity of each C.V. triangle has been transferred to the control volume on the new mesh, that is, whether calculation of every overlap area and transfer of every impurity quantity have been completed (Step 209). If they are not completed, the routine returns to Step 207 to repeat calculation of an overlap area and transfer of every impurity quantity. When they are completed, the routine proceeds to Step 210.

Lastly, the impurity quantity transfer unit 16 divides a sum of transferred impurity quantities by an area of the control volume to obtain an impurity concentration at the grid point of the new mesh and complete integral interpolation of the impurities (Step 210).

Figure 5:
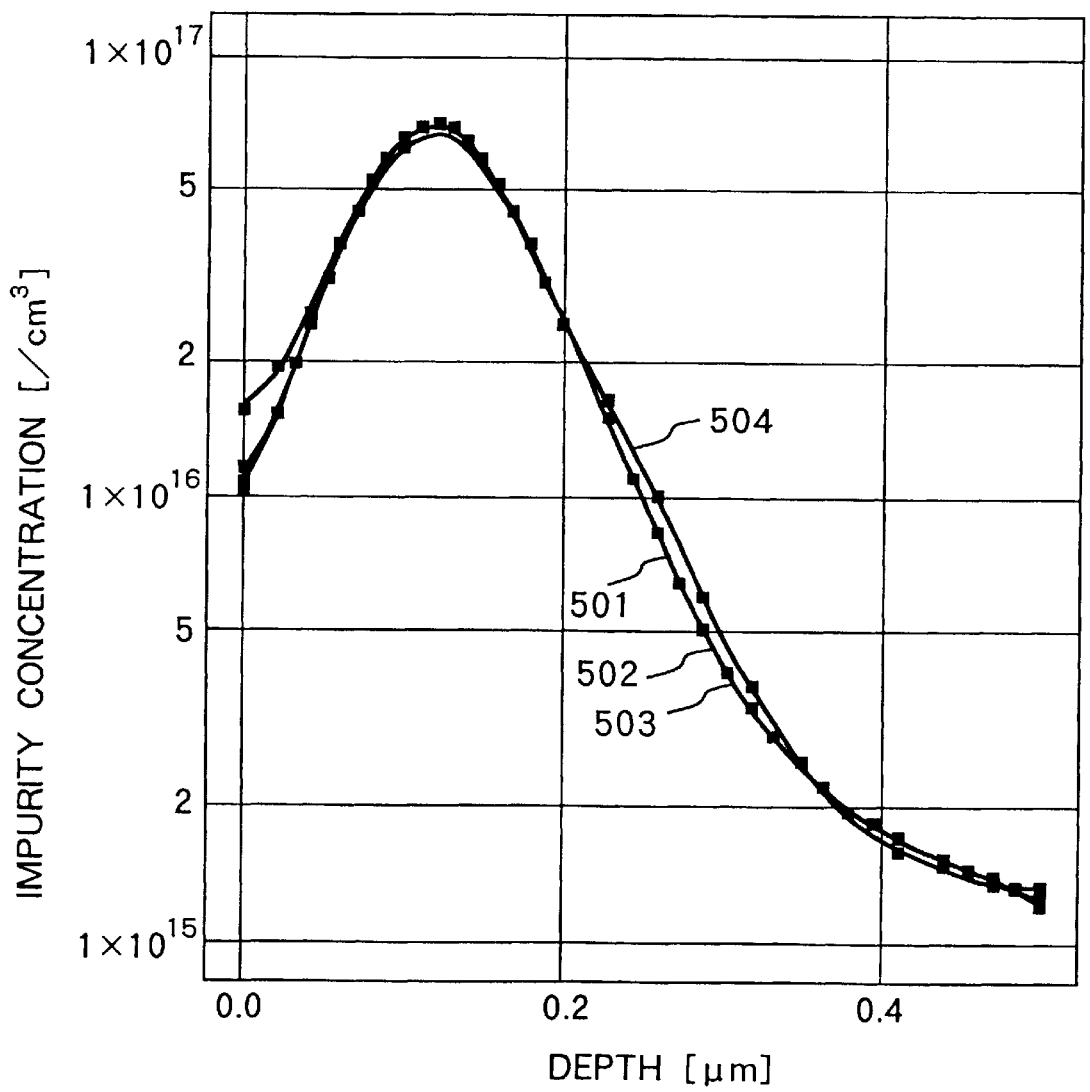
FIG. 5 is a graph showing change of impurity profiles in the depth direction when the impurity interpolation method according to the present embodiment is repeated.

FIG. 5 is a graph showing results of integral interpolation of impurities according to the present embodiment. Here, vertical profiles are obtained assuming that with a space between meshes fixed on the premise of one-dimensional structure, integral interpolation is conducted with only a position of a mesh staggered by half a cycle. In FIG. 5, a curve 401 represents an initial impurity profile, a curve 402 represents an impurity profile obtained after the integral interpolation is conducted once by the above method, and curves 403 and 404 represent impurity profiles obtained after the integral interpolation is conducted ten times and 100 times by the above method, respectively. As can be seen from the graph, the present embodiment enables not only about ten times of impurity interpolation which might be necessary in oxidation simulation etc. but also 100 times of integral interpolation to substantially reproduce the initial profile.

As is clear from the foregoing result, the present embodiment enables reduction of pseudo diffusion. As a result, integral interpolation can be conducted without decreasing precision in a case of simulation of an oxidation process which involves a plurality of times of mesh generation and in a case where adaptive meshes following an impurity distribution is employed.

Figure 6:
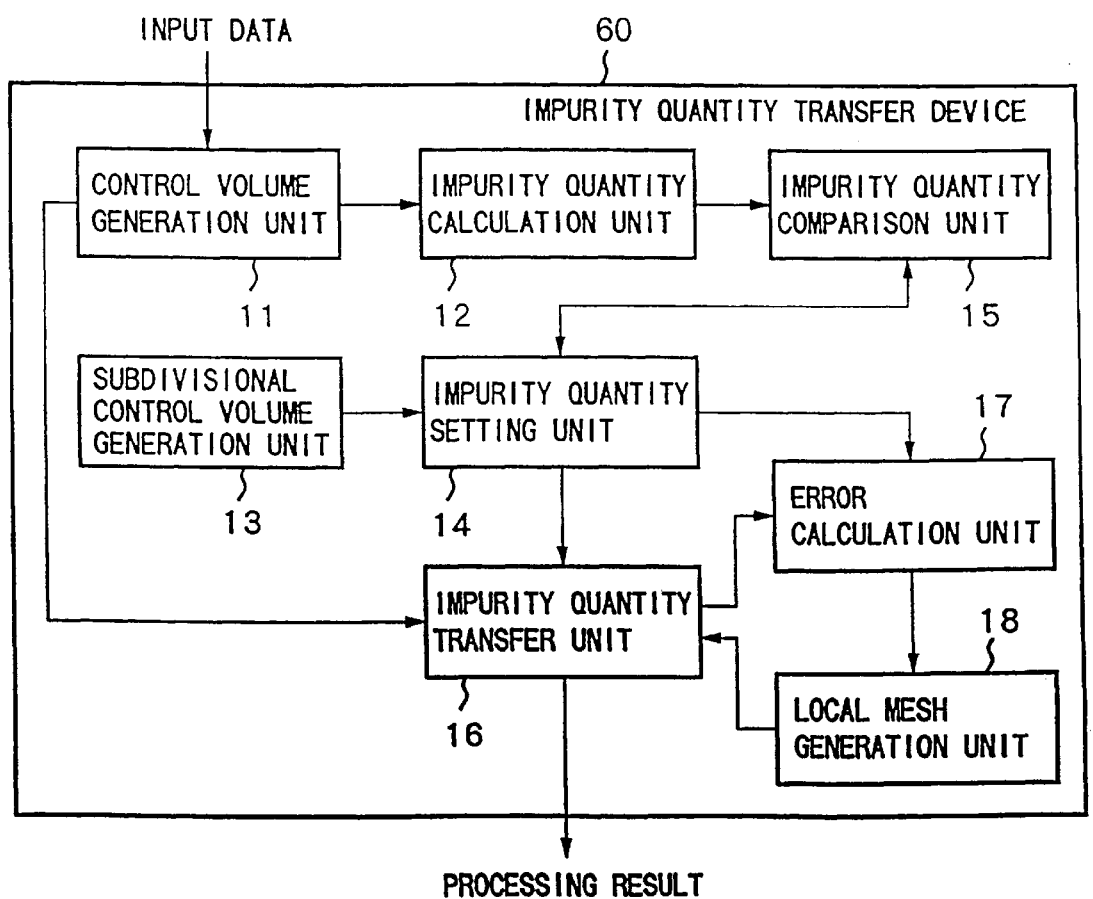
FIG. 6 is a block diagram showing structure of an impurity quantity transfer device according to another embodiment of the present invention.

FIG. 6 is a block diagram showing structure of an impurity transfer device according to another embodiment of the present invention. An impurity quantity transfer device 60 of the present embodiment, similarly to the impurity transfer device 10 shown in FIG. 1, includes a control volume generation unit 11, an impurity quantity calculation unit 12, a subdivisional control volume generation unit 13, an impurity quantity setting unit 14, an impurity quantity comparison unit 15, and an impurity quantity transfer unit 16 and further includes an error calculation unit 17 for calculating errors caused by pseudo diffusion in integral interpolation by using an impurity concentration determined by the impurity quantity setting unit 14, and a local mesh generation unit 18 for generating a local mesh so as to reduce the errors when determination is made that said error calculated by said. error calculation unit (17) will not be less than a predetermined value. Since in the present embodiment, structure of other components than the error calculation unit 17 and the local mesh generation unit 18 is the same as that of their counterparts in the impurity quantity transfer device 10 shown in FIG. 1, the same reference numerals are allotted thereto to omit their description. In FIG. 6, illustration is made only of a characteristic part of the structure of the present embodiment and that of the remaining common part is omitted.

Figure 7:
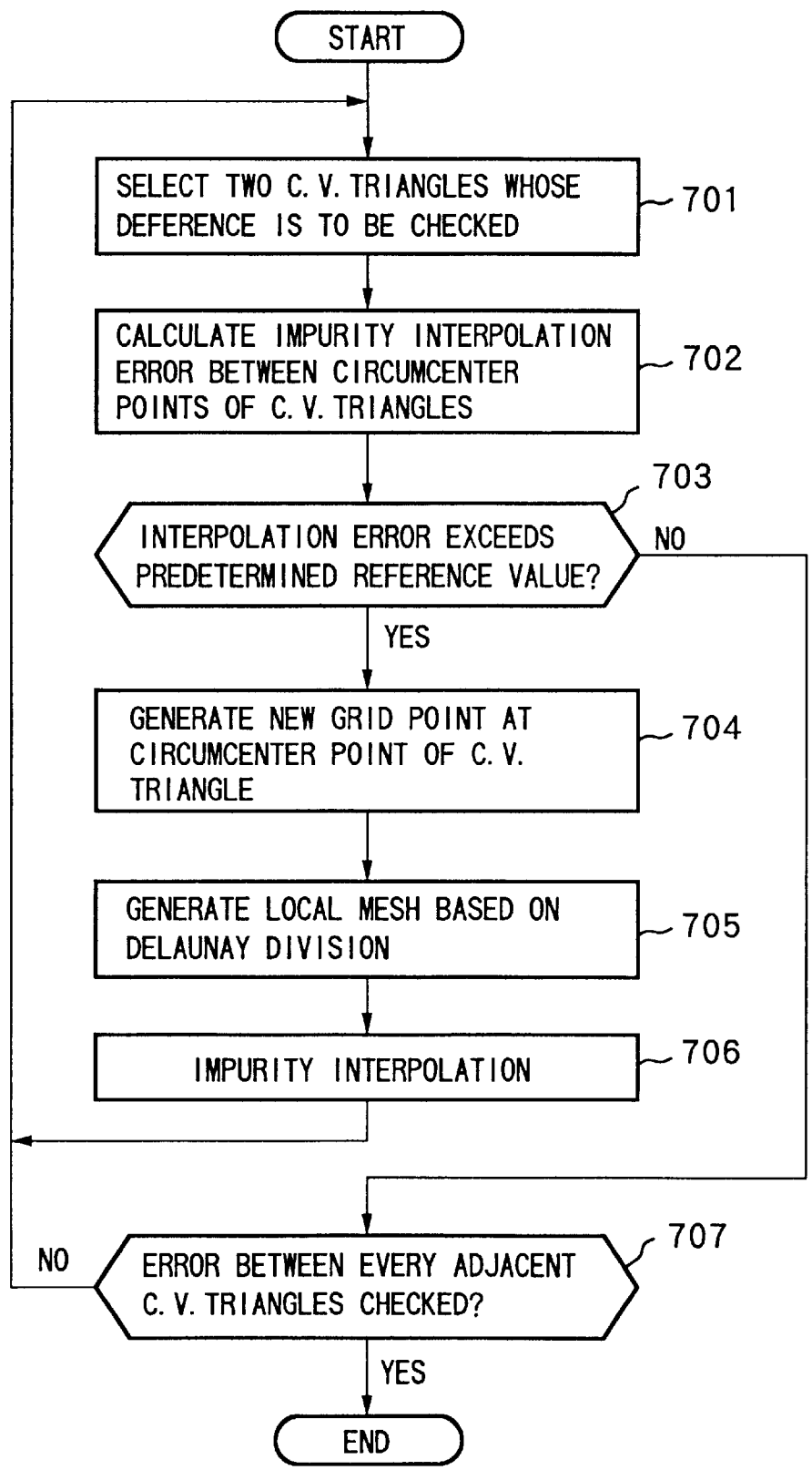
FIG. 7 is a flow chart showing operation of impurity interpolation processing according to the present embodiment.
Figure 8:
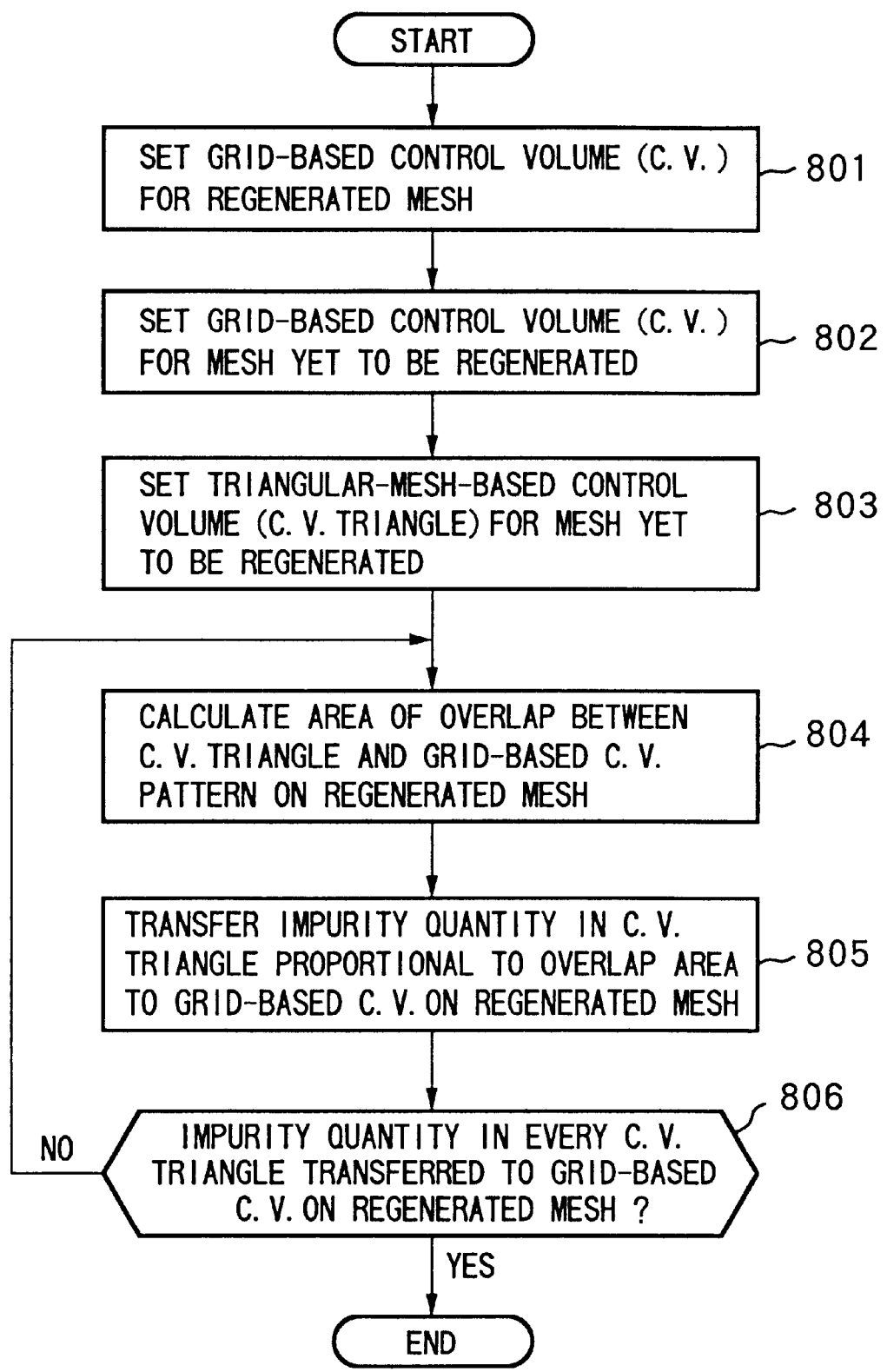
FIG. 8 is a flow chart showing a conventional integral interpolation method.
Figure 9:
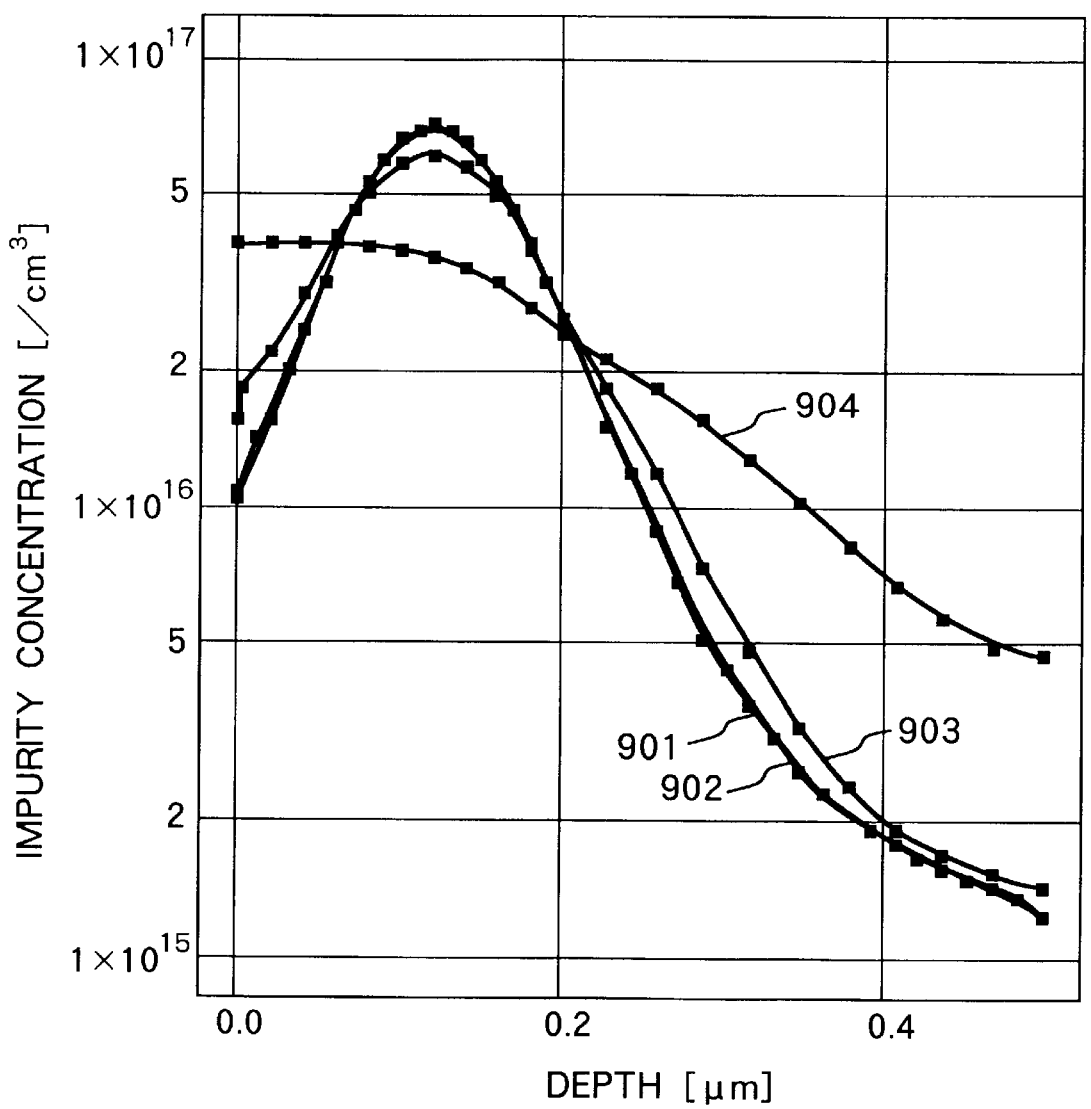
FIG. 9 is a graph showing change of impurity profiles in the depth direction when the conventional integral interpolation method is repeated.

Next, operation of impurity interpolation processing according to the present embodiment will be described. In the present embodiment, the impurity interpolation processing is executed according to roughly the same procedure of the operation described with reference to FIG. 2, with the only difference being that errors caused by pseudo diffusion in integral interpolation are estimated and when the errors are large, a mesh point is additionally inserted on a new mesh. Processing of executing estimate of pseudo diffusion errors and insertion of new mesh points to repeat impurity interpolation by using a mesh with the mesh points appropriately inserted is referred to as precision-designated impurity interpolation processing. More specifically, in the precision-designated impurity interpolation processing, when an impurity concentration of each C.V. triangle is determined at Step 206 of the operation example shown in FIG. 2, an error caused at the execution of integral interpolation is evaluated by using impurity concentrations at circumcenters of the C.V. triangles and when the error is large, a mesh point is additionally inserted to subsequently conduct impurity interpolation. FIG. 7 is a flow chart showing a procedure of precision-designated impurity interpolation processing. Of the operation according to the present embodiment, operation up to the determination of an. impurity concentration of a C.V. triangle is the same as the operation at Steps 201 to 206 shown in FIG. 2 and therefore neither illustration nor description thereof is made.

With reference to FIG. 7, after the calculation of an impurity concentration of each C.V. triangle made by the impurity quantity setting unit 14, the error calculation unit 17 first selects two adjacent C.V. triangles whose difference is to be evaluated (checked) (Step 701). Then, the unit 17 calculates an impurity interpolation error between the adjacent C.V triangles (Step 702). Estimate of an impurity interpolation error will be conducted, for example, according to the following expression (3):

$$\text{interpolation error} = \frac{16C(1+C)^2}{C^2 + 6C + 1} \tag{3}$$

where C denotes an impurity concentration ratio of $C_1$ to $C_2$ of two C.V. triangles, that is, "$C=C_1/C_2$".

After the calculation of the interpolation error, determination is made whether the interpolation error exceeds a preset reference value or not (step 703). When the error is within the reference value, the routine proceeds to Step 707. On the other hand, when the error exceeds the reference value, the local mesh generation unit 18 newly generates a grid point at a circumcenter point of a C.V. triangle determined to have a large error (Step 704) to conduct local mesh generation ensuring the Delaunay division (Step 705). Then, limiting to a region where the mesh has been modified, an impurity concentration of a newly generated mesh point is calculated to conduct impurity interpolation processing following the same procedure as that of Steps 207 to 209 shown in the flow chart of FIG. 2 (Step 706). Thereafter, returning to Step 701 to conduct re-evaluation of errors, Steps 701 to 706 is repeated until the error fails to exceed the reference value.

When the error fails to exceed the reference value, determination is made whether evaluation of an interpolation error between every adjacent C.V. triangles is completed or not (Step 707). When not all the processing is completed, processing will be repeated starting at Step 701. When evaluation of all the errors is completed, precision-designated impurity interpolation processing will be finished.

A local mesh generation method ensuring the Delaunay division is disclosed, for example, in Japanese Patent Laying-Open (Kokai) No. Heisei 7-219977, entitled "Mesh Generation Method". The literature recites, as a technique of adding or deleting a mesh point to Delaunay-divided meshes while ensuring the Delaunay division, the angle method of taking a point at which an angle with a side of a predetermined polygon formed on a mesh is the largest as a new mesh point, the recursive method, the octree method and the like.

According to the present embodiment, highly precise impurity interpolation with an error not exceeding a prescribed interpolation error can be realized by estimating an error caused by pseudo diffusion and inserting a grid point when an error exceeds a reference value.

As described in the foregoing, by changing a control volume of an old mesh from a grid-based large region into a mesh-based small region and defining an impurity quantity for each control volume according to an impurity concentration of its surroundings while maintaining dose, the impurity quantity transfer device of the present invention and the impurity interpolation method thereof enable even a region of sharp impurity concentration gradient to have an accurate distribution with reduced pseudo diffusion when impurity quantities of the old mesh are transferred to a new mesh by means of integral interpolation.

In addition, the device and the method of the present invention prevents errors from exceeding a prescribed reference value by evaluating errors using impurity concentrations of C.V. triangles and inserting a new mesh point into a region with a large error, thereby realizing highly precise impurity interpolation with impurity interpolation errors designated.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. In semiconductor device process simulation, an impurity quantity transfer device which transfers, according to deformation of a semiconductor device, an impurity value defined on a first mesh generated on said semiconductor device before the deformation to a second mesh generated on said semiconductor device after the deformation, comprising:

control volume generation means for generating, on said second mesh, a grid-based control volume region bridging a plurality of mesh elements, said plurality of mesh elements sharing a grid point on said second mesh as a vertex, and said grid-based control volume region being a polygon having circumcenters of each of the bridged plurality of mesh elements on said second mesh as vertices;

subdivisional control volume generation means for subdividing, on a mesh element basis on said first mesh, a region of a mesh element, and thereby generating at least one mesh-based control volume, wherein:

said subdivisional control volume generation means generates, on said first mesh, a first-mesh grid-based control volume region, bridging a plurality of mesh elements sharing a grid point on said first mesh, said first-mesh grid-based control volume region comprising a polygon having circumcenters of each of the bridged plurality of mesh elements on said first mesh as vertices, each mesh element on said first mesh is a polygon having grid points of said first mesh as vertices, and said region of a mesh element, which is subdivided by said subdivisional control volume generation means, is that portion of the respective mesh element within said first-mesh grid-based control volume region;

impurity quantity calculation means for calculating a sum of impurity quantities corresponding to each grid point on said first mesh based on a total area of each mesh-based control volume surrounding the grid point and an impurity concentration at the grid point;

impurity quantity setting means for initially setting, with respect to each mesh-based control volume, an impurity concentration of the mesh-based control volume by using an impurity concentration of each vertex of mesh elements on said first mesh which overlaps the mesh-based control volume, as well as determining an impurity concentration of each mesh-based control volume as a function of the initial set value of the impurity concentration multiplied by a conversion coefficient;

impurity quantity comparison means for accumulating, based on an area of each mesh-based control volume connected to a grid point on said first mesh and the corresponding impurity concentration initially set by said impurity quantity setting means of a respective mesh-based control volume, impurity quantities corresponding to the grid point on said first mesh, as well as comparing a sum of impurity quantities calculated by said impurity quantity calculation means and said accumulated impurity quantities to obtain said conversion coefficient allowing the compared values to agree with each other; and impurity quantity transfer means for calculating, with respect to each mesh-based control volume, an area of an overlap region between said mesh-based control volume and said grid-based control volume region on said second mesh, and transferring an impurity quantity of said mesh-based control volume to said grid-based control volume region on said second mesh, according to the calculated area, to calculate an impurity quantity corresponding to each grid point on said second mesh.

2. The impurity quantity transfer device as set forth in claim 1, wherein said impurity quantity transfer means divides a calculated impurity quantity corresponding to each grid point on said second mesh by an area of a grid-based control volume on said second mesh to determine an impurity concentration corresponding to each grid point on said second mesh.

3. The impurity quantity transfer device as set forth in claim 1, wherein said impurity quantity setting means takes an impurity concentration obtained by a linear interpolation based on the impurity concentration of each vertex of mesh elements on said first mesh as the initial set value of an impurity concentration at a respective control volume, and determines, as said impurity concentration at the respective control volume, a value obtained by multiplying said initial set value by said conversion coefficient ($\alpha$) obtained by said impurity quantity comparison means according to the following expression:

$$\alpha = \frac{\text{sum of impurity quantities corresponding to each grid point}}{\text{sum of impurity quantities in control volume triangle surrounding each grid point}}.$$

4. The impurity quantity transfer device as set forth in claim 3, wherein said impurity quantity transfer means divides a calculated impurity quantity corresponding to each grid point on said second mesh by an area of a grid-based control volume on said second mesh to determine an impurity concentration corresponding to each grid point on said second mesh.

5. The impurity quantity transfer device as set forth in claim 1, further comprising:

error calculation means for calculating an error caused by pseudo diffusion in integral interpolation by using the impurity concentration determined by said impurity quantity setting means, and local mesh generation means for generating, when determination is made that said error calculated by said error calculation means will be not less than a predetermined value, a local mesh so as to reduce the error.

6. The impurity quantity transfer device as set forth in claim 5, wherein said impurity quantity transfer means divides a calculated impurity quantity corresponding to each grid point on said second mesh by an area of a grid-based control volume on said second mesh to determine an impurity concentration corresponding to each grid point on said second mesh.

7. The impurity quantity transfer device as set forth in claim 5, wherein said impurity quantity setting means takes an impurity concentration obtained by a linear interpolation based on an impurity concentration of each vertex of mesh elements on said first mesh as a initial set value of an impurity concentration at a respective control volume, and determines, as an impurity concentration at the respective control volume, a value obtained by multiplying said initial set value by said conversion coefficient '$\alpha$' obtained by said impurity quantity comparison means according to the following expression:

$$\alpha = \frac{\text{sum of impurity quantities corresponding to each grid point}}{\text{sum of impurity quantities in control volume triangle surrounding each grid point}}.$$

8. The impurity quantity transfer device as set forth in claim 1, wherein:

said mesh element of said first mesh is a triangle, and each mesh-based control volume generated by said subdivisional control volume generation means consists of a right triangle having:

a circumcenter of said mesh element of said first mesh as a first vertex, a vertex of said mesh element of said first mesh as a second vertex, and a hypotenuse that is a line segment connecting said first and second vertices;

wherein said vertex of said mesh element of said first mesh is said grid point on said first mesh to which the accumulated impurity quantities correspond.

9. The impurity quantity transfer device as set forth in claim 1, wherein:

each mesh-based control volume generated by said subdivisional control volume generation means is a polygon with vertices consisting of:

the shared grid point on said first mesh;

the circumcenter of the mesh element being subdivided to form the mesh-based control volume; and an intersection of an edge of the mesh element being subdivided and an edge of the first-mesh grid-based control volume region, said edge of the mesh element being an edge terminating at the shared grid point on said first mesh.

10. In semiconductor device process simulation, an impurity interpolation method of transferring, according to deformation of a semiconductor device, an impurity value defined on a first mesh generated on said semiconductor device before the deformation to a second mesh generated on said semiconductor device after the deformation, comprising the steps of:

generating, on said second mesh, a grid-based control volume region bridging a plurality of mesh elements, said plurality of mesh elements sharing a grid point on said second mesh as a vertex, and said grid-based control volume region being a polygon having circumcenters of each of the bridged plurality of mesh elements on said second mesh as vertices;

subdividing, on a mesh element basis on said first mesh, a region of a mesh element, and thereby generating at least one mesh-based control volume, said subdividing including:

generating, on said first mesh, a first-mesh grid-based control volume region, bridging a plurality of mesh elements sharing a grid point on said first mesh, said first-mesh grid based control volume region comprising a polygon having circumcenters of each of the bridged plurality of mesh elements on said first mesh as vertices, wherein the bridged plurality of mesh elements includes the mesh element being subdivided, wherein each mesh element on said first mesh is a polygon having grid points of said first mesh as vertices, and wherein the region to be subdivided of each mesh element on said first mesh is that portion of the respective mesh element within said first-mesh grid-based control volume region;

calculating a sum of impurity quantities corresponding to each grid point on said first mesh based on a total area of each mesh-based control volume surrounding the grid point and an impurity concentration at the grid point;

initially setting, with respect to each mesh-based control volume, an impurity concentration of the mesh-based control volume by using an impurity concentration of each vertex of mesh elements on said first mesh which overlaps the mesh-based control volume;

accumulating impurity quantities corresponding to the grid point on said first mesh, based on an area of each mesh-based control volume connected to a grid point on said first mesh and the corresponding initially set impurity concentration of a respective mesh-based control volume;

comparing a sum of impurity quantities calculated at said impurity quantity calculation step and said accumulated impurity quantities to obtain a conversion coefficient allowing the compared values to agree with each other;

determining an impurity concentration of each mesh-based control volume as a function of said initial set value of the impurity concentration multiplied by said conversion coefficient;

calculating, with respect to each mesh-based control volume, an area of an overlap region between each mesh-based control volume and said grid-based control volume region on said second mesh; and transferring an impurity quantity of each mesh-based control volume to said grid-based control volume region on said second mesh, according to a calculated area, to calculate an impurity quantity corresponding to each grid point on said second mesh.

11. The impurity interpolation method as set forth in claim 10, further comprising a step of dividing an impurity quantity corresponding to each grid point on said second mesh calculated at said impurity quantity transfer step by an area of a grid-based control volume on said second mesh to determine an impurity concentration corresponding to each grid point on said second mesh.

12. The impurity interpolation method as set forth in claim 10, wherein at said impurity concentration initial setting step, an impurity concentration obtained by a linear interpolation based on said impurity concentration of each vertex of mesh elements on said first mesh is taken as the initial set value of the impurity concentration at a respective control volume, and at said impurity quantity determination step, a value obtained by multiplying said initial set value by said conversion coefficient ($\alpha$) obtained by said impurity quantity comparison step according to the following expression is determined as an impurity concentration at the respective volume:

$$\alpha = \frac{\text{sum of impurity quantities corresponding to each grid point}}{\text{sum of impurity quantities in control volume triangle surrounding each grid point}}$$

13. The impurity interpolation method as set forth in claim 10, further comprising the steps of:

calculating an error caused by pseudo diffusion in integral interpolation by using the impurity concentration determined at said impurity quantity determination step, and generating, when determination is made that said error calculated at said error calculation step will be not less than a predetermined value, a local mesh so as to reduce the error, wherein:

said overlap region calculation step limits said area of said overlap region for each mesh-based control volume on which said local mesh has been generated to an area of said local mesh, and said error calculation step, said local mesh generation step, said overlap area calculation step and said impurity quantity transfer step are repeated until said error calculated at said error calculation step goes below said predetermined value.

14. The impurity interpolation method as set forth in claim 10, wherein:

said mesh element of said first mesh is a triangle, and each mesh-based control volume consists of a right triangle having:

a circumcenter of said mesh element of said first mesh as a first vertex, a vertex of said mesh element of said first mesh as a second vertex, and a hypotenuse that is a line segment connecting said first and second vertices;

wherein said vertex of said mesh element of said first mesh is said grid point on said first mesh to which the accumulated impurity quantities correspond.

15. The impurity interpolation method as set forth in claim 10, wherein:

each mesh-based control volume is a polygon with vertices consisting of:
  the shared grid point on said first mesh;
  the circumcenter of the mesh element being subdivided to form the mesh-based control volume; and
  an intersection of an edge of the mesh element being subdivided and an edge of the first-mesh grid-based control volume region, said edge of the mesh element being an edge terminating at the shared grid point on said first mesh.

16. In semiconductor device process simulation, a computer readable memory storing a computer program for controlling an impurity quantity transfer device which transfers, according to deformation of a semiconductor device, an impurity value defined on a first mesh generated on said semiconductor device before the deformation to a second mesh generated on said semiconductor device after the deformation, said computer program comprising the steps of:
  generating, on said second mesh, a grid-based control volume region bridging a plurality of mesh elements, said plurality of mesh elements sharing a grid point on said second mesh as a vertex, and said grid-based control volume region being a polygon having circumcenters of each of the bridged plurality of mesh elements on said second mesh as vertices;
  subdividing, on a mesh element basis on said first mesh, a region of a mesh element, and thereby generating at least one mesh-based control volume, said subdividing including:
    generating, on said first mesh, a first-mesh grid-based control volume region, bridging a plurality of mesh elements sharing a grid point on said first mesh, said first-mesh grid based control volume region comprising a polygon having circumcenters of each of the bridged plurality of mesh elements on said first mesh as vertices,
    wherein the bridged plurality of mesh elements includes the mesh element being subdivided,
    wherein each mesh element on said first mesh is a polygon having grid points of said first mesh as vertices, and
    wherein the region to be subdivided of each mesh element on said first mesh is that portion of the respective mesh element within said first-mesh grid-based control volume region;
  calculating a sum of impurity quantities corresponding to each grid point on said first mesh based on a total area of each mesh-based control volume surrounding the grid point and an impurity concentration at the grid point;
  initially setting, with respect to each mesh-based control volume, an impurity concentration of the mesh-based control volume by using an impurity concentration of each vertex of mesh elements on said first mesh which overlaps the mesh-based control volume;
  accumulating impurity quantities corresponding to the grid point on said first mesh, based on an area of each mesh-based control volume connected to a grid point on said first mesh and the corresponding initially set impurity concentration of a respective mesh-based control volume;
  comparing a sum of impurity quantities calculated at said impurity quantity calculation step and said accumulated impurity quantities to obtain a conversion coefficient allowing the compared values to agree with each other;
  determining an impurity concentration of each mesh-based control volume by using said initial set value and said conversion coefficient;
  calculating, with respect to each mesh-based control volume, an area of an overlap region between said mesh-based control volume and said grid-based control volume region on said second mesh; and
  transferring an impurity quantity of said mesh-based control volume to said grid-based control volume region on said second mesh, according to a calculated area, to calculate an impurity quantity corresponding to each grid point on said second mesh.

17. The computer readable memory as set forth in claim 16, wherein
  said computer program further comprises a step of dividing an impurity quantity corresponding to each grid point on said second mesh calculated at said impurity quantity transfer step by an area of a grid-based control volume on said second mesh to determine an impurity concentration corresponding to each grid point on said second mesh.

18. The computer readable memory as set forth in claim 16, wherein
  at said impurity concentration initial setting step of said computer program, an impurity concentration obtained by a linear interpolation based on said impurity concentration of each vertex of mesh elements on said first mesh is taken as the initial set value of the impurity concentration at the respective control volume, and
  at said impurity quantity determination step,
  a value obtained by multiplying said initial set value by said conversion coefficient ($\alpha$) obtained by said impurity quantity comparison step according to the following expression is determined as an impurity concentration at the respective control volume:

$$\alpha = \frac{\text{sum of impurity quantities corresponding to each grid point}}{\text{sum of impurity quantities in control volume triangle surrounding each grid point}}$$

19. The computer readable memory as set forth in claim 16, wherein said computer program further comprises the steps of:
  calculating an error caused by pseudo diffusion in integral interpolation by using the impurity concentration determined at said impurity quantity determination step, and
  generating, when determination is made that said error calculated at said error calculation step will be not less than a predetermined value, a local mesh so as to reduce the error,
  wherein:
    said overlap area calculation step limits said area of said overlap region for each mesh-based control volume on which said local mesh has been generated to an area of said local mesh, and
    said error calculation step, said local mesh generation step, said overlap area calculation step and said impurity quantity transfer step are repeated until said error calculated at said error calculation step goes below said predetermined value.

20. The computer readable memory as set forth in claim 16, wherein:
  said mesh element of said first mesh is a triangle, and
  each mesh-based control volume consists of a right triangle having:

a circumcenter of said mesh element of said first mesh as a first vertex, a vertex of said mesh element of said first mesh as a second vertex, and a hypotenuse that is a line segment connecting said first and second vertices;

wherein said vertex of said mesh element of said first mesh is said grid point on said first mesh to which the accumulated impurity quantities correspond.

21. The computer readable memory as set forth in claim 16, wherein:

each mesh-based control volume is a polygon with vertices consisting of:

the shared grid point on said first mesh;

the circumcenter of the mesh element being subdivided to form the mesh-based control volume; and an intersection of an edge of the mesh element being subdivided and an edge of the first-mesh grid-based control volume region, said edge of the mesh element being an edge terminating at the shared grid point on said first mesh.

\* \* \* \* \*